United States Patent
Brocilo et al.

(10) Patent No.: US 11,703,920 B2
(45) Date of Patent: *Jul. 18, 2023

(54) SWITCHING NETWORK FOR DYNAMICALLY RECONFIGURABLE POWER PLANE

(71) Applicant: Google LLC, Mountain View, CA (US)

(72) Inventors: Drazena Brocilo, Los Gatos, CA (US); Selver Corhodzic, Campbell, CA (US)

(73) Assignee: Google LLC, Mountain View, CA (US)

( * ) Notice: Subject to any disclaimer, the term of this patent is extended or adjusted under 35 U.S.C. 154(b) by 60 days.

This patent is subject to a terminal disclaimer.

(21) Appl. No.: 16/923,252

(22) Filed: Jul. 8, 2020

(65) Prior Publication Data
US 2022/0011833 A1   Jan. 13, 2022

(51) Int. Cl.
| G06F 1/18 | (2006.01) |
| G06F 1/26 | (2006.01) |
| H05K 7/14 | (2006.01) |

(52) U.S. Cl.
CPC ........... *G06F 1/189* (2013.01); *G06F 1/263* (2013.01); *G06F 1/266* (2013.01); *H05K 7/1492* (2013.01)

(58) Field of Classification Search
CPC .......... G06F 1/189; G06F 1/263; G06F 1/266; H05K 7/1492; H05K 7/1497; H02J 4/00; H02J 1/084; H02J 3/007; H02J 9/061
See application file for complete search history.

(56) References Cited

U.S. PATENT DOCUMENTS

| 6,191,500 | B1* | 2/2001 | Toy | H02J 3/46 307/64 |
| 7,705,487 | B2* | 4/2010 | Chaiquin | H02J 3/38 307/64 |
| 8,902,569 | B1* | 12/2014 | Wishman | G06F 1/26 361/622 |
| 9,865,998 | B1* | 1/2018 | Emert | H02J 3/00 |
| 2005/0200205 | A1* | 9/2005 | Winn | H02J 9/08 307/64 |
| 2009/0234906 | A1* | 9/2009 | Chai | G06F 8/656 709/203 |
| 2011/0148213 | A1 | 6/2011 | Baldwin et al. | |

(Continued)

FOREIGN PATENT DOCUMENTS

WO   2018126216 A2   7/2018

OTHER PUBLICATIONS

Extended European Search Report for European Patent Application No. 20207356.5 dated Apr. 19, 2021. 11 pages.

*Primary Examiner* — Danny Chan
(74) *Attorney, Agent, or Firm* — Lerner David LLP

(57) ABSTRACT

A system including a power bus configured to supply power to a plurality of server racks arranged within a space of a building, a first power source connection positioned at a first side of the building and configured to supply power from a first power source to the power bus, a second power source positioned at a second side of the building different from the first side and configured to supply power from a second power source to the power bus, and a plurality of diverter switches arranged within the power bus. Each diverter switch may be configured to receive a respective control signal and, responsive to the respective control signal, redirect power within the power bus.

20 Claims, 5 Drawing Sheets

(56) References Cited

U.S. PATENT DOCUMENTS

| | | | | |
|---|---|---|---|---|
| 2011/0245988 A1* | 10/2011 | Ingels | .................. | H02J 3/14 |
| | | | | 700/295 |
| 2012/0155027 A1* | 6/2012 | Broome | ................ | B66C 19/00 |
| | | | | 361/696 |
| 2012/0242149 A1* | 9/2012 | Chuang | ............... | G06F 30/392 |
| | | | | 716/120 |
| 2013/0293017 A1* | 11/2013 | Englert | ................. | H02J 9/04 |
| | | | | 307/65 |
| 2015/0035358 A1* | 2/2015 | Linkhart | ............ | H02J 3/0073 |
| | | | | 307/64 |
| 2015/0036254 A1* | 2/2015 | Emert | ................... | H02J 3/38 |
| | | | | 361/93.1 |
| 2015/0234440 A1* | 8/2015 | Gardner | ............... | G06F 1/30 |
| | | | | 713/300 |
| 2015/0378408 A1 | 12/2015 | Kaplan | | |
| 2016/0105988 A1* | 4/2016 | Englert | .............. | H05K 7/1497 |
| | | | | 361/679.02 |
| 2016/0197483 A1* | 7/2016 | Steinert | ............. | H02J 3/0073 |
| | | | | 307/18 |
| 2017/0358914 A1* | 12/2017 | Chaiquin | ............. | H02H 7/28 |
| 2018/0024608 A1 | 1/2018 | Kaplan | | |
| 2018/0295029 A1* | 10/2018 | Shivanna | ............. | H04L 67/322 |
| 2019/0044748 A1* | 2/2019 | Morin | ................. | H04L 12/40 |
| 2019/0057684 A1* | 2/2019 | Roh | ..................... | G10L 15/22 |

\* cited by examiner

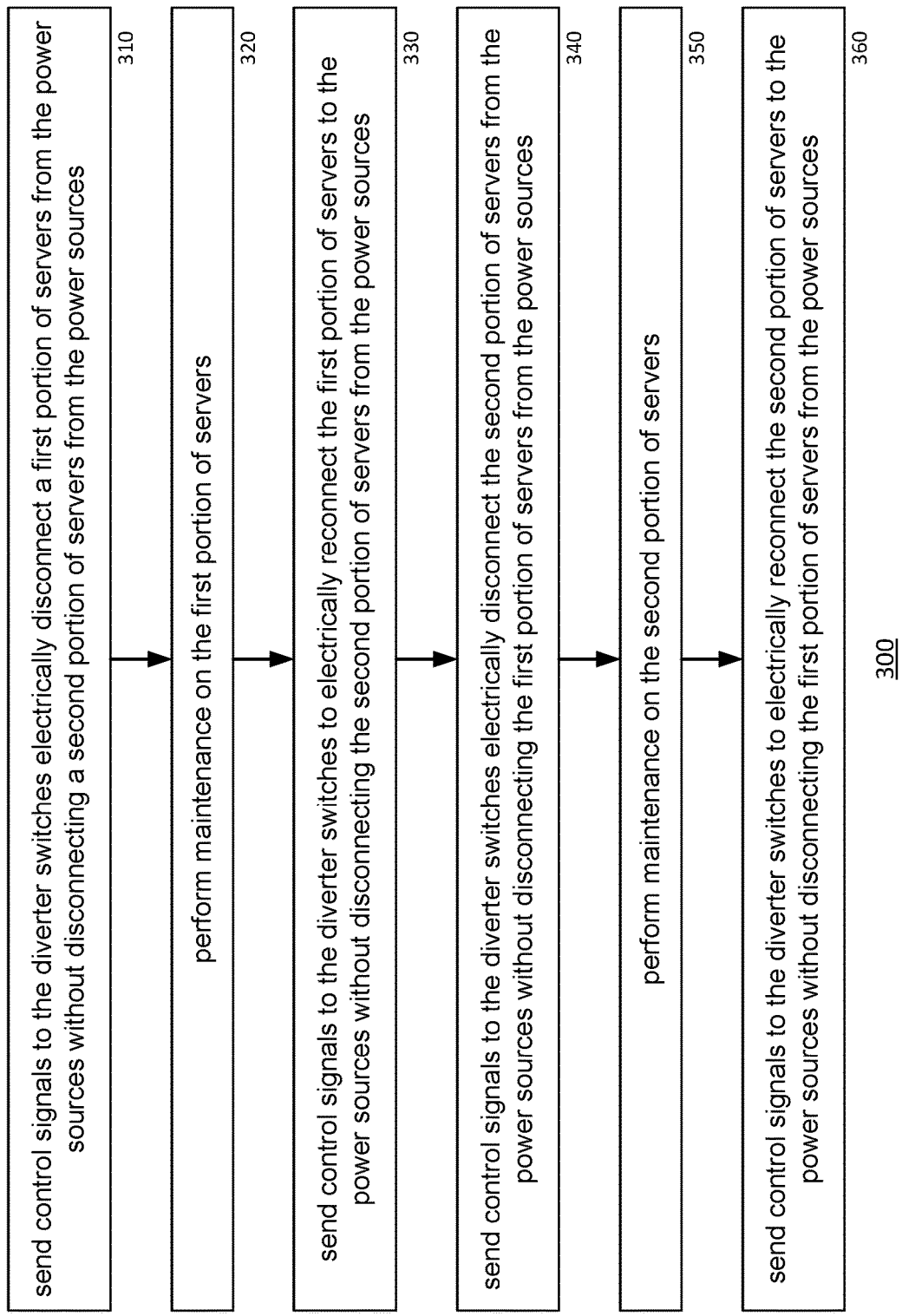

SWITCHING NETWORK FOR DYNAMICALLY RECONFIGURABLE POWER PLANE

BACKGROUND

Large scale datacenters include numerous server racks that require electrical power to operate. Datacenter buildings may have several floors, each floor having server racks thereon. For each floor, the server racks may be kept at floor level, while power is routed to the server racks via busways positioned overhead the server racks, underneath the server racks, or at floor level alongside the server racks. The electrical power provided to a single floor of the datacenter may be on the order of tens of megawatts, and the electrical power provided to the datacenter buildings may be on the order of hundreds of megawatts.

The electrical power is provided from one or more power sources. Typically, the electrical power is routed into the building from one side, and divided between aisles of servers racks via a branch network of busways. In an example system, electrical power may be fed to one or more floors of a datacenter from one or more power sources by branching electrical connections, and the electrical connections connect to parallel busways. The busways deliver power from a first side of the building to a second side of the building. Each busway may connect to server racks along parallel aisles within the building.

Power distribution is subject to several drawbacks. Because power is provided from only the first side of the building, a current density of the provided power is much higher at the first side than at the second side. For example, for a busway providing power to a number of sections of server racks connected in series, a downstream section of server racks may require a higher total amount of current than an upstream section. However, because the current for both the upstream and downstream sections must be provided through the busways of the upstream section, the upstream busways may have a higher current density than the downstream busways. When the busways are typically designed uniformly, this may lead to underutilization of the conducting material of the busways closer to the downstream, second side of the building. Complex and expensive infrastructure, including transfer switches and breakers, is also needed to branch the power sources to the busways and to the server racks of the multiple aisles of the datacenter.

Another problem with unidirectional power distribution is that malfunctioning upstream equipment can result in downtime for downstream equipment. Redundant busways and additional infrastructure are needed in order to provide a backup power distribution solution for when upstream equipment malfunctions, as well as to accommodate maintenance for one section of the system without taking the rest of the system offline.

Additionally, because each aisle of the datacenter is designed to receive the same amount of electrical power, it is necessary to balance the server racks of the datacenter between the busways and aisles such that a power density of one busway or aisle is not imbalanced with the power density of another busway or aisle. In order to avoid imbalance, servers requiring a relatively high current density, such as machine learning data catalog (MLDC) servers, must be distributed throughout the datacenter, and careful advance planning is needed to avoid these high power density servers from being concentrated in a single portion of the building.

BRIEF SUMMARY

The present disclosure provides a switching network for a dynamically configurable power plane for powering a large scale system such as a datacenter. The power plane may be arranged to receive electrical power from multiple sides of the building, and the switching network may control the direction and distribution of the received electrical power throughout the building.

One aspect of the present disclosure is directed to a system including a power bus configured to supply power to a plurality of server racks arranged within a space of a building, a first power source connection positioned at a first side of the building and configured to supply power from a first power source to the power bus, a second power source positioned at a second side of the building different from the first side and configured to supply power from a second power source to the power bus, and a plurality of diverter switches arranged within the power bus, wherein each diverter switch is configured to receive a respective control signal, and responsive to the respective control signal, redirect power within the power bus.

In some examples, the first side and the second side may be opposite sides of the building.

In some examples, the plurality of diverter switches may be configurable to yield a first arrangement in which a current density of the power bus is higher on the first side of the building than on the second side of the building, and a second arrangement in which the current density of the power bus is higher on the second side of the building than on the first side of the building.

In some examples, the plurality of server racks may be divided into discrete portions, wherein each discrete portion is connected to each of the first and second power sources, and wherein the plurality of diverter switches are configurable to disconnect any one of the discrete portions of the plurality of server racks from the first and second power sources while the other portions of the plurality of server racks remain connected to at least one of the first or second power source.

In some examples, the plurality of diverter switches may be arranged to permit power flow through the power bus in a snake configuration.

In some examples, the plurality of diverter switches may be arranged to permit power flow through the power bus in a ring configuration.

In some examples, the plurality of diverter switches may be arranged to permit power flow through the power bus in a mesh configuration.

In some examples, the plurality of diverter switches may include at least one bidirectional switch connected to two busways.

In some examples, the plurality of diverter switches may include at least one multidirectional switch connected to three or more busways.

In some examples, the plurality of diverter switches may include at least one solid state switch.

In some examples, the power bus may be included in a power plane positioned vertically above the plurality of server racks.

In some examples, the space of the building may include a first section containing a first portion of servers assigned a relatively high priority, and a second section containing a second portion of servers assigned a relatively low priority, and the plurality of diverter switches may be arranged to provide a higher level power arrangement to the first section than to the second section. The first portion of servers may include at least one of machine learning servers or networking gear.

In some examples, the system may include a plurality of branch circuits configured to connect busways of the power bus to server racks, wherein each server rack is configured to be connected to the power bus via a respective branch circuit, and wherein each branch circuit is connected within the power bus to both the first power source and the second power source. Each server rack may be connected to the power bus by only one branch circuit.

In some examples, the power bus may be a direct current power bus.

In some examples, the power bus may be an alternating current power bus.

Another aspect of the disclosure is directed to a datacenter including a system according to any of the embodiments described herein, and a plurality of server racks arranged within a space of a building In some examples, the datacenter may include one or more controllers connected to the plurality of diverter switches and configured to provide the respective control signals to redirect power within the power bus.

Another aspect of the disclosure is directed to a server maintenance method for updating portions of servers within a datacenter that includes a power bus configured to supply power to a plurality of server racks arranged within a space of a building, a first power source connected to the power bus from a first side of the building and configured to supply power to the power bus, a second power source connected to the power bus from a second side of the building different from the first side and configured to supply power to the power bus, and a plurality of diverter switches arranged within the power bus, and one or more controllers connected to the plurality of diverter switches to redirect power within the power bus. The method may include providing, from the one or more controllers, first control signals to the plurality of diverter switches to electrically disconnect a first portion of servers from the first and second power sources without disconnecting a second portion of servers from the first and second power sources, conducting maintenance on the first portion of servers, providing, from the one or more controllers, second control signals to the plurality of diverter switches to electrically reconnect the first portion of servers to the first and second power sources without disconnecting the second portion of servers from the first and second power sources, providing, from the one or more controllers, third control signals to the plurality of diverter switches to electrically disconnect the second portion of servers from the first and second power sources without disconnecting the first portion of servers from the first and second power sources, conducting maintenance on the second portion of servers, and providing, from the one or more controllers, fourth control signals to the plurality of diverter switches to electrically reconnect the second portion of servers to the first and second power sources without disconnecting the first portion of servers from the first and second power sources. The first and second portions of servers may be portioned according to respective levels of confidentiality.

BRIEF DESCRIPTION OF THE DRAWINGS

FIG. 3 is a flow diagram of an example server maintenance routine, according to aspects of the disclosure.

DETAILED DESCRIPTION

Overview

The technology relates generally to a switching network for distribution of electrical power in large scale systems such as datacenters, and more particularly to a switching network for a dynamically configurable power plane for powering a large scale system such as a datacenter.

Electrical power may be distributed to the large scale system over a power bus. The power bus may include busways for carrying the electrical power. The power bus may include several connecting elements, including busway connections for connecting the power bus to rows of server racks in the datacenter, and power source connections for connecting the power bus to one or more power sources at multiple points. The switching network may include a plurality of switches included in the power bus and configured to direct power between the power sources and busway connections in order to provide power to all server racks.

The switches may be controlled using control signals in order to distribute power throughout the datacenter in a desired fashion. For example, power may be diverted away from a section of the datacenter while the rest of the datacenter continues to receive power and remains operational. This may be done in order to perform maintenance on the disconnected section of the datacenter while the rest of datacenter remains operational.

The system may be arranged to control the concentration of power within the power bus. For example, power source connections may be located at different quadrants or sides of the datacenter. Additionally, bidirectional and multi-directional switches may be provided within the power bus to facilitate the redirection of power throughout the system. Such configurations avoid unidirectional flow of current from a high current density side of the datacenter to a low current density side. As such, it may be possible to achieve a more uniform current density throughout the datacenter, while at the same time enabling high power density to be directed to particular locations of the datacenter as needed.

The arrangements described herein provide numerous advantages over a conventional datacenter power bus providing unidirectional current flow from "upstream" bus elements to "downstream" elements. For example, a conventional datacenter power bus may require balancing between server racks at different current densities, which carries the risk of upstream failures resulting in downstream outages, and general underutilization of the downstream bus elements since current density decreases as the distance from the power sources increases. By contrast, the power bus and switching network arrangement of the present disclosure allows for bidirectional and multidirectional current flow, meaning that bus elements are not "upstream" or "downstream" from one another. Therefore, current density may be balanced throughout the datacenter and bus elements may be utilized more efficiently?.

Example Systems

Figure 1:
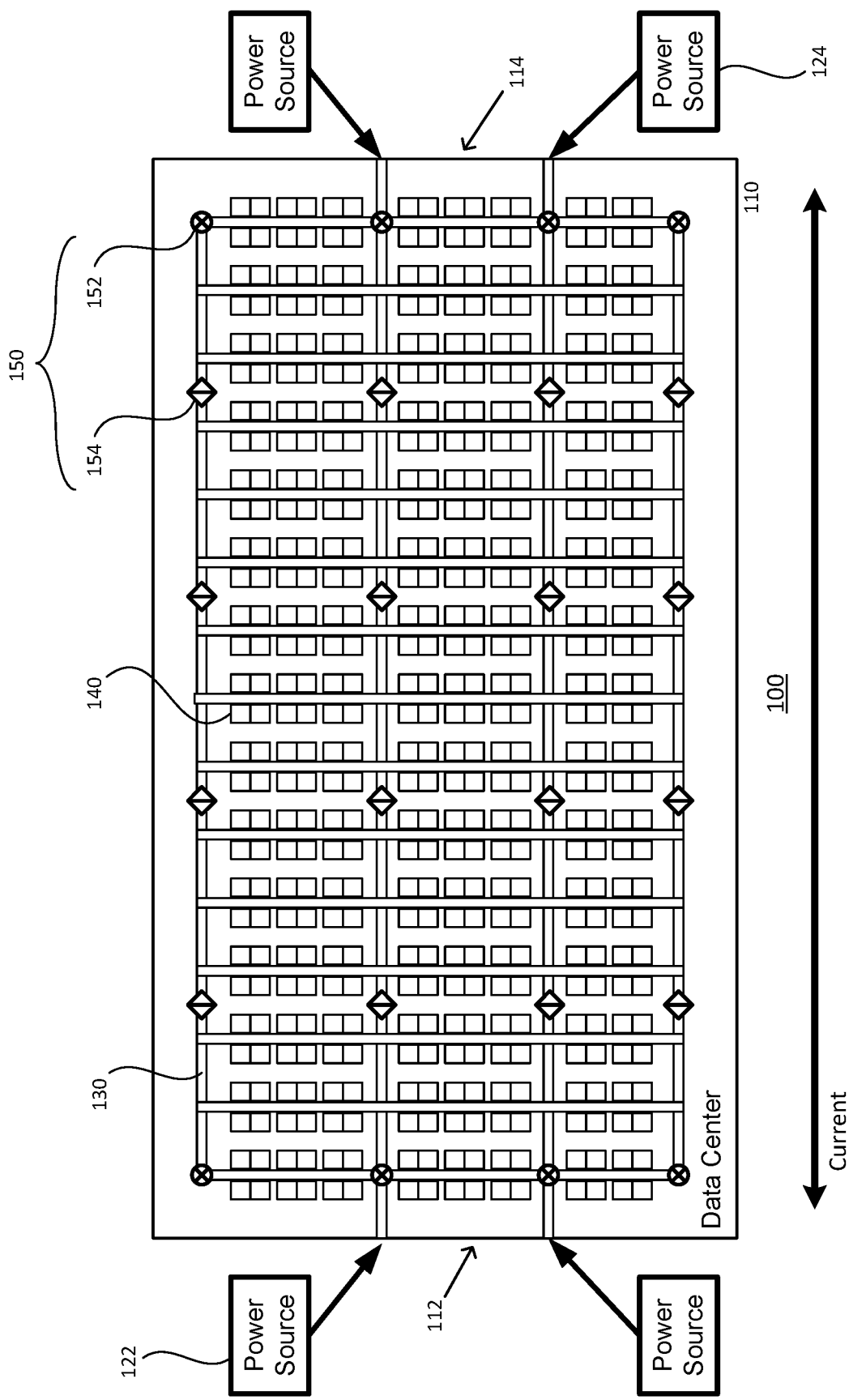
FIG. 1 is a schematic diagram of electrical connections of an example datacenter system according to aspects of the disclosure.

FIG. 1 illustrates an example system 100 for distribution of electrical power in a large scale datacenter 110. The datacenter 110 may receive electrical power from more than one side of the building. For instance, a first side 112 of the building may include electrical connections between at least a first power source 122 and a power bus 130, and a second side 114 of the building may include electrical connections between at least a second power source 124 and the power bus 130.

The power bus 130 may be a busway made up of a network of bus sections. Each bus section may connect to one or more server racks 140 using cables connected between the server racks 140 and tap connections (not shown) to the busbars of the busway. The power bus 130 may be a power plane positioned vertically overhead the server racks 140 in order to leave space at the datacenter floor.

The power bus 130 may be configured to divert and direct electrical power throughout the building over the network of bus sections. Diverter switches 150 may be strategically positioned throughout the network in order to direct the flow of electrical current. In the example of FIG. 1, diverter switches 150 are positioned in a grid arrangement through the layout of the power bus 130, although in other examples different arrangements may be used. The diverter switches may be on-load diverter switches (OLDS) to allow for redirection of the electrical power without interrupting the power supply. The OLDS may include multi-directional diverter switches 152 and bi-directional diverter switches 154. Generally, the multi-directional diverter switches 152 are positioned at intersection points of the power bus 130 and are connected to three or more busways, whereas the bi-directional diverter switches 154 are positioned at non-intersecting points of the power bus 130 and are connected to two busways. Of course, in some configurations, multi-directional switches may be provided in locations having fewer than three busway connections, either due to switch availability issues or in anticipation of future busway connections. The diverter switches may be solid state switches, having a response time on the order of 100 ns. The switching may be performed using zero crossing control. Reconfiguring the network of diverter switches to redirect power may take up to but not more than about 5-20 ms, although in some instances, faster reconfiguration times may be achieved.

In the example of FIG. 1, the first side 112 and second side 114 of the building are opposite sides of the building. However, in other examples, the first and second sides may be adjacent or non-opposite sides of the building, provided that the electrical power does not run in a single downstream direction through the building. Additionally, more than two power sources may be provided to the building. In the example of FIG. 1, four power sources are shown, although in other examples more or fewer power sources may be connected. It should also be understood that in other examples, power sources may be connected to busway elements from any side of the building. Furthermore, although FIG. 1 shows a schematic layout of only one floor of a datacenter, it should be understood that the datacenter may include multiple floors, each floor including additional servers and server racks, which may have the same or a similar layout as the floor shown in FIG. 1.

Each of the diverter switches 150 may be connected to one or more controllers (not shown). In some examples, the controllers may be manually operated physical switches accessible from within the datacenter building. The physical switches may be distributed throughout the building, concentrated in a specific location, or some combination of the two. In other examples, the controllers may include one or more computing systems having one or more processors, memory for storing instructions operations to be executed by the one or more processors, and input/output components.

The processor can be a well-known processor or other lesser-known types of processors, and may be a dedicated controller such as an ASIC. The memory may be a type of non-transitory computer readable medium capable of storing information accessible by the processor 120 such as a hard-drive, solid state drive, tape drive, optical storage, memory card, ROM, RAM, DVD, CD-ROM, write-capable, and read-only memories. The input/output components may be capable of transmitting and receiving data, such as receiving input signals such as user inputs or monitored data about the datacenter, and transmitting control signals to control the diverter switches 150.

Control signals from the controllers may be coordinated to connect or disconnect discrete portions of the datacenter from the supplied electrical power. For example, diverter switches in a section of the datacenter may be opened in order to prevent electrical power from flowing to that section of the datacenter, while electrical power continues to flow to the remaining sections of the datacenter. Because the power bus 130 is an interconnected network of bus elements, each of the server racks may be electrically connected to each of the power sources connected to the power bus 130. The diverter switches may be controlled to disconnect a discrete portion of the datacenter from all of the power sources, which the remaining portions of the datacenter remain electrically connected to one or more of the power sources.

Figure 2A:
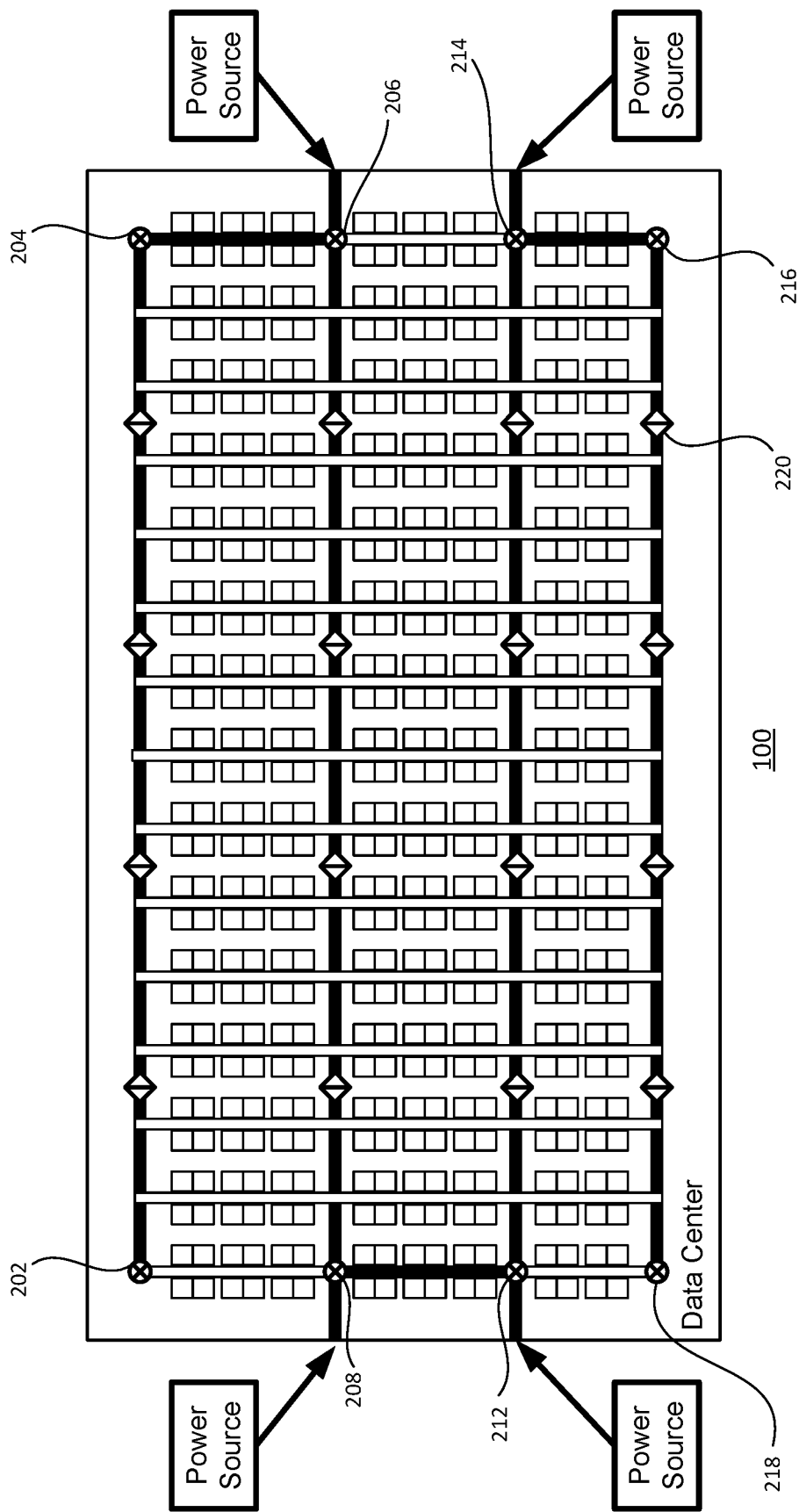
FIGS. 2A-2C are schematic diagrams of example electrical routing schemes for the example datacenter system of FIG. 1.
Figure 2B:
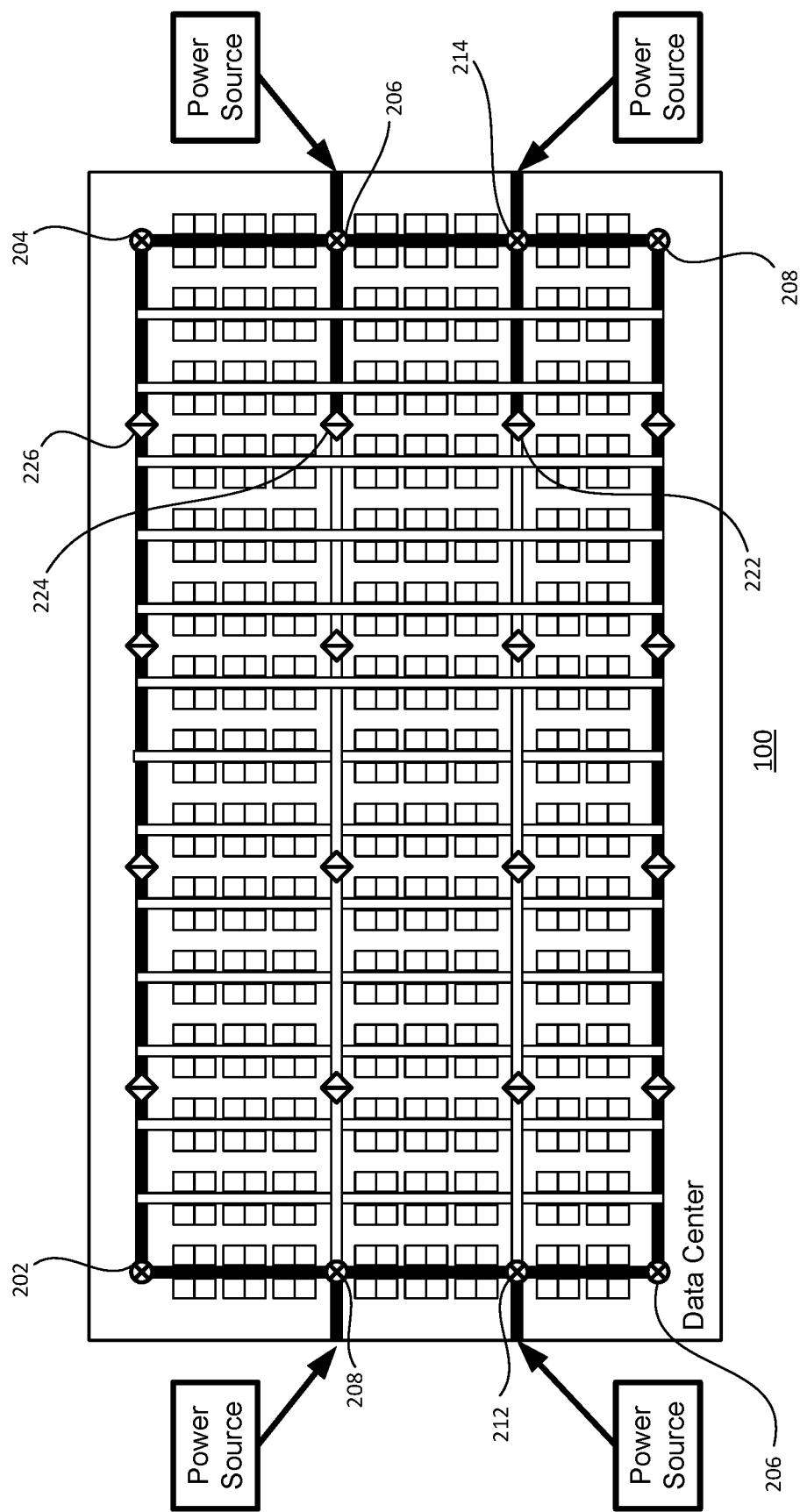
Figure 2C:
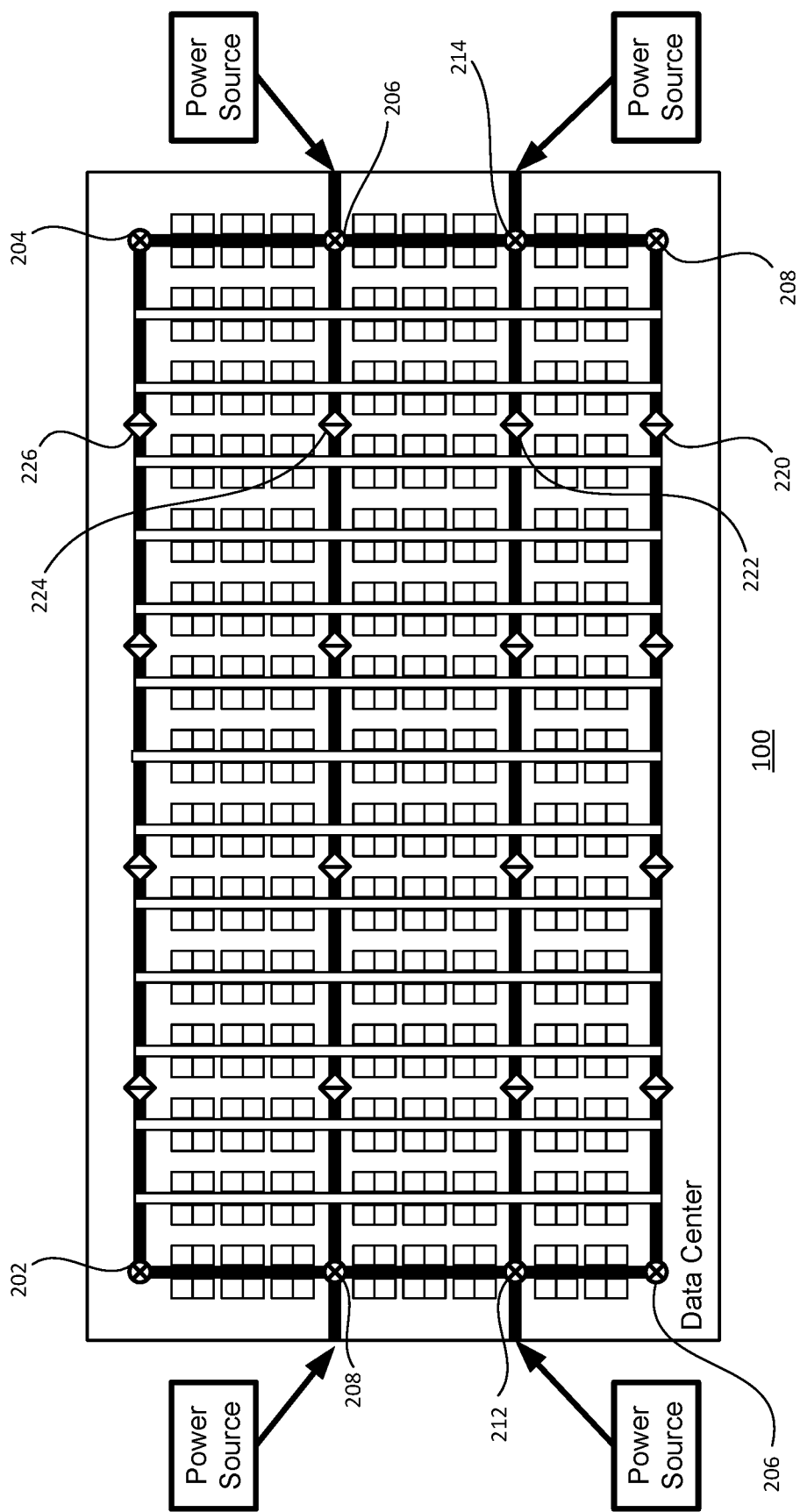

Different combinations of control operations may be provided to the diverter switches in order to provide different configurations of power distribution. FIGS. 2A-2C show different example power distribution configurations for the example system 100 of FIG. 1.

In the example of FIG. 2A, the diverter switches are controlled to permit electrical power to flow through the power bus in a snake configuration. Multi-directional diverter switches are positioned at the power source connections at 206, 208, 212 and 214, and at the corners of the power bus at 202, 204, 216 and 218. Bi-directional diverter switches 220 are positioned between each pair of multi-directional switches along a length of the building from the first side to the second side. In the example snake configuration of FIG. 2A, each bidirectional switch 220 is on to allow power to flow in both directions. Each multi-directional switch is at least partially on to allow partial flow of power through the power bus. Each pair of multi-directional switches, 202 and 204, 206 and 208, 212 and 214, and 216 and 218 is controlled to allow power to flow from one switch of the pair to the other. The multi-directional switches are also controlled such that flow of power is permitted between adjacent pairs of multi-directional switches in the widthwise direction of the building in an alternating fashion. In the example of FIG. 2A, on the first side of the building switches 202 and 208 do not allow power to flow therebetween, switches 208 and 212 allow power to flow therebetween, and switches 212 and 218 do not allow power to flow therebetween. In a similar manner, on the second side of the building, switches 204 and 206 allow power to flow therebetween, switches 206 and 214 do not allow power to flow therebetween, and switches 214 and 216 allow power to flow therebetween. This arrangement results in power flowing in an S or snake configuration.

In the example of FIG. 2B, the diverter switches are controlled to permit electrical power to flow through the power bus in a ring-like configuration. In one example ring configuration, each multi-directional switch may be at least partially on to allow power to flow around a perimeter of the shown portion of the building, and the bi-directional switches may be on or off. Variations to the ring configuration may allow for some power to branch off from the ring. For instance, in FIG. 2B, multi-directional switches are controlled to be on in all directions and direct power towards bi-directional switches 222 and 224 closer to a middle of the building. The bidirectional switches 222 and 224 are controlled to allow power flow in only one direction and not to flow though towards the next pair of bidirectional switches along the length of the building. The ring configuration, as compared to the snake configuration of FIG. 2A, may provide for increased current density in some parts of the building while reducing current density in other parts of the building. For example, current density in FIG. 2B may increase along a perimeter of the shown portion of the building, and decrease for a middle portion inside the perimeter.

In the example of FIG. 2C, the diverter switches are controlled to permit electrical power to flow through the power bus in a mesh configuration. In this example, each one of the bidirectional and multidirectional switches, 202, 204, 206, 2088, 212, 214, 216, 218, 222, 224 and so on, is controlled to be on and to allow power to flow to all connected elements of the power bus. The mesh configuration, as compared to the snake and ring arrangements of FIGS. 2A and 2B, may provide for increased current density in some parts of the building while reducing current density in other parts of the building.

In the example system 100 of FIGS. 1 and 2A-2C, connections between the power bus and the server racks may be made by branch circuits. Because the power bus is a single network connected to multiple power sources, each branch circuit may be configured to connect a corresponding one or more server racks to multiple sources of power through the power bus. As such, only one branch circuit connection may be needed to connect a given server rack to the multiple sources of power in the datacenter.

Power distribution in a datacenter may be performed using either alternating current (AC) power or direct current (DC) power. Additionally, diverter switches may be adapted for directing either one of AC or DC power. Thus, the example system 100 of FIGS. 1 and 2A-2C may be arranged so as to deliver power to the server racks using either AC or DC power.

Because the example system 100 of FIGS. 1 and 2A-2C is connected to power sources on multiple sides 112, 114 of the building, there is no one side of the building from which all current flows. As such, no particular side or component of the power bus can be characterized as "upstream" or "downstream" from another side or component. Certain components and sides may be "upstream" vis-à-vis a single power source, but "downstream" vis-à-vis a different power source. This provides several advantages over typical arrangements having upstream elements, downstream elements, and one-directional current flow. This may result in a more uniform current density throughout the datacenter. Providing uniform current density, in turn, may avoid the underutilization of busway elements, such as bus ducts having a predefined capacity of electrical power. Also, if power is cut off from one power source due to failure of power distribution components at one side of the building, the server racks may still receive power from the power sources connected to the other side of the building through the power distribution elements on the other side of the building.

Additionally, because the example system 100 of FIGS. 1 and 2A-2C includes diverter switches throughout the power bus, power from the multiple power sources may be directed throughout the network of busways, such as more power being provided to areas requiring a high current density, and away from areas requiring lower current density. As such, the system described herein provides improved control over the provision of high power density to particular locations of the datacenter as needed.

For example, in conventional datacenters in which the provision of high current density to specific locations is not possible, it is often necessary to disperse individual server racks having high current density throughout the datacenter building space, instead of concentrating the high density server racks together in a discrete location, such as an aisle or quadrant of the building. For instance, high current density may be required for server racks including networking gear, or for server racks performing machine learning operations, such as in a machine learning data catalog. Dispersal of the high current density server racks may be necessary in order to balance power needs throughout the building, since power distribution is limited in its configurability. However, having to disperse high current density server racks requires advance planning, and makes it difficult to add more high current density or low current density server racks at a later time without disrupting the previous configuration. Advance planning and disrupting server rack configurations add cost and time to maintenance operations. Additionally, some high current density server racks may include confidential data that would be preferable to section off in a discrete corner or section of the building instead of dispersing throughout the building.

By contrast, the ability to provide high current density to specific locations avoids the need to plan server rack configurations in advance. New high density servers may be clustered together in a single region, and the diverter switches of the power bus may be controlled to make a power supply configuration that provides high current density in a location of the new server racks. This may allow for server racks requiring high current density and high confidentiality, such as MLDC server racks, to be concentrated within a discrete portion of the building. Access may be granted to low-confidentiality servers, such as for maintenance operations, while access to the high confidentiality servers remains restricted.

In a similar vein, new low density servers may be clustered together in a single region, and the diverter switches of the power bus may be controlled to make a power supply configuration that provides low current density in a location of the new server racks.

The above concepts are equally applicable for initial arrangement of high current density and low current density server racks within the datacenter when first being set up, as well as subsequent addition of new server racks after the datacenter has already been set up.

Example Methods

FIG. 3 is a flow diagram of an example maintenance routine 300 in accordance with the present application. The routine may permit for separate sections of a datacenter to be serviced at separate times. A first section of the datacenter may include a first portion of server racks, and a second section of the datacenter may include a second portion of server racks. The sections may be physically separate from one another, such that one section may be disconnected from multiple power sources without affecting the connection between the multiple power sources and the other section. This may be advantageous for conducting maintenance on one portion of server racks without affecting the operation of another portion of the server racks. It should be understood that the routine described herein is merely an example, and in other examples, certain steps may be added, subtracted, replaced or reordered.

At block 310, first control signals may be provided to the diverter switches of the power bus to electrically disconnect the first portion of servers from the connected power sources. The control signals may be provided from the controllers connected to the diverter switches. The control signals may be provided automatically or manually. Additionally, disconnection of the first portion of servers may be accomplished without disconnecting another, second portion of servers from the power sources. At block 320, maintenance may be conducted on the disconnected first portion of servers. At block 330, second control signals may be provided from the controllers to the diverter switches of the power bus to electrically reconnect the first portion of servers to the power sources. As with the disconnection process of block 310, reconnecting the first portion of servers at block 330 may be accomplished without disconnecting the second portion of servers from the power sources. Upon completion of blocks 310-430 of routine 300, maintenance for the first portion of servers is completed.

In some examples, the second portion of servers may be maintained in the same manner as the first portion. Blocks 340-460 describe maintenance of the second portion of servers. At block 340, third control signals may be provided to the diverter switches of the power bus to electrically disconnect the second portion of servers from the connected power sources. Disconnection of the second portion of servers may be accomplished without disconnecting the first portion of servers. At block 350, maintenance may be conducted on the disconnected second portion of servers. At block 360, fourth control signals may be provided from the controllers to the diverter switches of the power bus to electrically reconnect the second portion of servers to the power sources, again without disconnecting the first portion of servers from the power sources in the process.

At no time of the maintenance routine 300 does disconnection of an "upstream" element cause disconnection of a "downstream" element. This is because the system of the present disclosure provides multi-directional current flow, and lacks elements that may be characterized as "upstream" and "downstream" in absolute terms.

Additionally, the maintenance routine 300 allows for the separate maintenance of high-confidentiality and low-confidentiality servers based on their locations, since in the above described example systems, servers may be clustered based on such properties as confidentiality without concern for load balancing or advance layout planning. As noted above, conventional datacenters typically require high current density server racks to be dispersed within the physical space of the datacenter building in order to provide appropriate load balancing between power distribution elements of the building. By contrast, the example arrangements of the present disclosure permit for high current density server racks to be concentrated in a discrete physical location of the datacenter building. By extension, server racks having a high level of confidentiality, such as MLDCs or network gear, may be concentrated in a more secure section of the building, whereby access may be provided to lower-confidentiality server racks while maintaining restricted access to the higher-confidentiality server racks.

Although the technology herein has been described with reference to particular embodiments, it is to be understood that these embodiments are merely illustrative of the principles and applications of the present technology. It is therefore to be understood that numerous modifications may be made to the illustrative embodiments and that other arrangements may be devised without departing from the spirit and scope of the present technology as defined by the appended claims.

Most of the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. As an example, the preceding operations do not have to be performed in the precise order described above. Rather, various steps can be handled in a different order, such as reversed, or simultaneously. Steps can also be omitted unless otherwise stated. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A system comprising:
a power bus configured to supply power to a plurality of server racks arranged within a space of a building, the power bus comprising a network of busways;
a first power source connection positioned at a first side of the building and configured to supply power from a first power source to the power bus in a first downstream direction, the first power source connection connected to a first busway included in the network of busways;
a second power source connection positioned at a second side of the building and configured to supply power from a second power source to the power bus in a second downstream direction different from the first downstream direction, the second power source connection connected to a second busway included in the network of busways; and
a plurality of diverter switches arranged in a grid within the power bus, the plurality of diverter switches including one or more multi-directional diverter switches positioned within the power bus at a location between the first busway and the second busway wherein each diverter switch is configured to:
receive a respective control signal; and
responsive to the respective control signal, redirect power within the power bus,
wherein the plurality of server racks are divided into discrete portions including at least a first discrete portion collectively located at a first location of the building and a second discrete portion collectively located at a second location of the building that is separate from the first location, wherein the first and second discrete portions are portioned according to respective levels of confidentiality, wherein each discrete portion is connected to each of the first and second power sources, and wherein the plurality of diverter switches are configurable to disconnect any one of the discrete portions of the plurality of server racks from the first and second power sources while the other portions of the plurality of server racks remain connected to at least one of the first or second power source.

2. The system of claim 1, wherein the first power source connection is connected to the first power source through a first wall on the first side of the building, and wherein the second power source connection is connected to the second power source through a second wall on the second side of the building, and wherein the first wall and the second wall of the building are opposite one another.

3. The system of claim 1, wherein the plurality of diverter switches are configurable to yield a first arrangement in which a current density of the power bus is higher on the first side of the building than on the second side of the building, and a second arrangement in which the current density of the power bus is higher on the second side of the building than on the first side of the building.

4. The system of claim 1, wherein the plurality of diverter switches are arranged within the power bus such that power flows through the power bus in a mesh configuration in response to a first set of control signals and in one of a snake configuration or a ring configuration in response to a second set of control signals.

5. The system of claim 4, wherein the plurality of diverter switches are arranged within the power bus to permit power flow through the power bus in the snake configuration in response to the second set of control signals.

6. The system of claim 4, wherein the plurality of diverter switches are arranged within the power bus to permit power flow through the power bus in the ring configuration in response to the second set of control signals.

7. The system of claim 6, wherein the plurality of diverter switches are arranged within the power bus to permit power flow through the power bus in the snake configuration in response to the second set of control signals and in the ring configuration in response to a third set of control signals.

8. The system of claim 1, wherein the power bus includes multiple power flow paths between the first busway and the second busway, and wherein the at least one multi-directional diverter switch is configured to control over which of the multiple paths that power flows from the first busway towards the second busway in response to a respective control signal received at the multi-directional diverter switch.

9. The system of claim 1, wherein the plurality of diverter switches includes at least two multidirectional switches, each multi-directional switch connected to three or more busways, wherein the at least two multidirectional switches are connected to each other by at least two different busways.

10. The system of claim 1, wherein the plurality of diverter switches includes at least one solid state switch.

11. The system of claim 1, wherein the power bus is included in a power plane positioned vertically above the plurality of server racks.

12. The system of claim 1, wherein the space of the building includes a first section containing a first portion of servers assigned a relatively high priority, and a second section containing a second portion of servers assigned a relatively low priority, and wherein the plurality of diverter switches are arranged to provide a higher level power arrangement to the first section than to the second section.

13. The system of claim 12, wherein the first portion of servers includes at least one of machine learning servers or networking gear.

14. The system of claim 1, further comprising a plurality of branch circuits configured to connect busways of the power bus to server racks, wherein each server rack is configured to be connected to the power bus via a respective branch circuit, and wherein each branch circuit is connected within the power bus to both the first power source and the second power source.

15. The system of claim 14, wherein each server rack is connected to the power bus by only one branch circuit.

16. The system of claim 1, wherein the power bus is a direct current power bus.

17. The system of claim 1, wherein the power bus is an alternating current power bus.

18. The system of claim 1, further comprising:
the plurality of server racks.

19. The system of claim 18, further comprising:
one or more controllers connected to the plurality of diverter switches and configured to provide the respective control signals to redirect power within the power bus.

20. A server maintenance method for updating portions of servers within a datacenter that includes a power bus configured to supply power to a plurality of server racks arranged within a space of a building, a first power source connected to the power bus from a first side of the building and configured to supply power to the power bus, a second power source connected to the power bus from a second side of the building different from the first side and configured to supply power to the power bus, and a plurality of diverter switches arranged within the power bus, and one or more controllers connected to the plurality of diverter switches to redirect power within the power bus, the method comprising:
providing, from the one or more controllers, first control signals to the plurality of diverter switches to electrically disconnect a first portion of servers from the first and second power sources without disconnecting a second portion of servers from the first and second power sources;
conducting maintenance on the first portion of servers;
providing, from the one or more controllers, second control signals to the plurality of diverter switches to electrically reconnect the first portion of servers to the first and second power sources without disconnecting the second portion of servers from the first and second power sources;
providing, from the one or more controllers, third control signals to the plurality of diverter switches to electrically disconnect the second portion of servers from the first and second power sources without disconnecting the first portion of servers from the first and second power sources;
conducting maintenance on the second portion of servers;
providing, from the one or more controllers, fourth control signals to the plurality of diverter switches to electrically reconnect the second portion of servers to the first and second power sources without disconnecting the first portion of servers from the first and second power sources,
wherein the first portion of servers are collectively located at a first location of the building and the second portion of servers are collectively located at a second location of the building that is separate from the first location, and
wherein the first and second portions of servers are portioned according to respective levels of confidentiality.

* * * * *